(12) United States Patent  (10) Patent No.: US 6,965,844 B1
Wang et al.  (45) Date of Patent: Nov. 15, 2005

(54) METHOD AND SYSTEM FOR PROCESSING STABILITY OF SEMICONDUCTOR DEVICES

(75) Inventors: Eugene Wang, Shanghai (CN); Jinghua Ni, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/880,761

(22) Filed: Jun. 29, 2004

(30) Foreign Application Priority Data

Jun. 14, 2004 (CN) ............... 200410025414 A

(51) Int. Cl.[7] ............................................. G06K 9/00
(52) U.S. Cl. ................................................... 702/179
(58) Field of Search ........................... 702/179, 181, 702/166, 18 D; 216/4, 60; 438/122; 382/149, 382/145, 141; 436/4; 510/352; 426/330

(56) References Cited

U.S. PATENT DOCUMENTS 6,792,386 B2 * 9/2004 Dobson .................. 702/181
2003/0229462 A1 12/2003 Wang

OTHER PUBLICATIONS

Wang, "Sameness-An Equivalency Index of Products, Processes and Services," 2002 Hawaii International Conference on Statistics, Jun. 5-9, 2002, 5 pages total.

* cited by examiner

Primary Examiner—John Barlow
Assistant Examiner—Tung Lau
(74) Attorney, Agent, or Firm—Townsend and Townsend and Crew LLP

(57) ABSTRACT

A method and system for processing stability of semiconductor devices. The method includes providing a first plurality of semiconductor devices, providing a second plurality of semiconductor devices, obtaining a first plurality of measured values corresponding to a characteristic, and obtaining a second plurality of measured values corresponding to the characteristic. Additionally, the method includes performing a first statistical analysis for the first plurality of measured values, determining a first statistical distribution, performing a second statistical analysis for the second plurality of measured values, and determining a second statistical distribution. Moreover, the method includes processing information associated with the first statistical distribution and the second statistical distribution, and determining an indicator. Also, the method includes processing information associated with the indicator, determining a confidence level, processing information associated with the confidence level, and determining whether the characteristic is stable.

20 Claims, 2 Drawing Sheets

Figure 2

METHOD AND SYSTEM FOR PROCESSING STABILITY OF SEMICONDUCTOR DEVICES

CROSS-REFERENCES TO RELATED APPLICATIONS

This application claims priority to Chinese Patent Application No. 200410025414.6, filed Jun. 14, 2004, entitled "Method and System for Processing Stability of Semiconductor Devices," by Inventors Eugene Wang and Jinghua Ni, commonly assigned, incorporated by reference herein for all purposes.

The following three commonly-owned co-pending applications, including this one, are being filed concurrently and the other two are hereby incorporated by reference in their entirety for all purposes:

1. U.S. patent application Ser. No. 10/880,761, in the name of Eugene Wang and Jinghua Ni, titled, "Method and System for Processing Stability of Semiconductor Devices,";
2. U.S. patent application Ser. No. 10/882,081, in the name of Eugene Wang and Jinghua Ni, titled, "Method and System for Processing Commonality of Semiconductor Devices,"; and
3. U.S. patent application Ser. No. 10/881,739, in the name of Eugene Wang, titled, "Method and System for Yield Similarity of Semiconductor Devices,".

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention is directed to integrated circuits and their processing for the manufacture of semiconductor devices. More particularly, the invention provides a method and system for processing stability of the manufacture of integrated circuits. Merely by way of example, the invention has been applied to certain quality characteristics for the manufacture of integrated circuits. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is processing stability used for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, in semiconductor industry, mass production stability is usually important. Semiconductor products should keep their functionalities substantially stable from month-to-month, week-to-week, or even day-to-day. Although in practice the functionalities may not remain exactly same, the functionalities should not change significantly in statistics. If the functionalities are statistically stable, then the manufacturing process is in harmony. These and other limitations are described throughout the present specification and more particularly below.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a method and system for processing stability of the manufacture of integrated circuits. Merely by way of example, the invention has been applied to certain quality characteristics for the manufacture of integrated circuits. But it would be recognized that the invention has a much broader range of applicability.

In a specific embodiment, the invention provides a method for processing stability of semiconductor devices. The method includes providing a first plurality of semiconductor devices, providing a second plurality of semiconductor devices, obtaining a first plurality of measured values corresponding to a characteristic associated with the first plurality of semiconductor devices, and obtaining a second plurality of measured values corresponding to the characteristic associated with the second plurality of semiconductor devices. Additionally, the method includes performing a first statistical analysis for the first plurality of measured values, determining a first statistical distribution based on at least information associated with the first statistical analysis, performing a second statistical analysis for the second plurality of measured values, and determining a second statistical distribution based on at least information associated with the second statistical analysis. Moreover, the method includes processing information associated with the first statistical distribution and the second statistical distribution, and determining an indicator based on at least information associated with the first statistical distribution and the second statistical distribution. The indicator is associated with an overlapping area between the first statistical distribution and the second statistical distribution. Also, the method includes processing information associated with the indicator, determining a confidence level based on at least information associated with the indicator, processing information associated with the confidence level, and determining whether the characteristic is stable based on at least information associated with the confidence level. The confidence level is associated with a second order of the indicator and a first order of the indicator. The determining whether the characteristic is stable includes if the confidence level is equal to or higher than 95%, determining the characteristic to be stable, and if the confidence level is lower than 95%, determining the characteristic to be unstable.

According to another embodiment, a computer-readable medium including instructions for processing stability of semiconductor devices. The computer-readable medium includes one or more instructions for receiving a first plurality of measured values corresponding to a characteristic associated with a first plurality of semiconductor devices, and one or more instructions for receiving a second plurality of measured values corresponding to the characteristic associated with a second plurality of semiconductor devices. Additionally, the computer-readable medium includes one or more instructions for performing a first statistical analysis for the first plurality of measured values, one or more instructions for determining a first statistical distribution based on at least information associated with the first statistical analysis, one or more instructions for performing a second statistical analysis for the second plurality of measured values, one or more instructions for determining a second statistical distribution based on at least information associated with the second statistical analysis, and one or more instructions for processing information associated with the first statistical distribution and the second statistical distribution. Moreover, the computer-readable medium includes one or more instructions for determining an indicator based on at least information associated with the first statistical distribution and the second statistical distribution. The indicator is associated with an overlapping area between the first statistical distribution and the second statistical distribution. Also, the computer-readable medium includes one or more instructions for processing information associated with the indicator, one or more instructions for determining a confidence level based on at least information associated with the indicator, one or more instructions for processing information associated with the confidence level, and one or more instructions for determining whether the characteristic is stable based on at least information associated with the confidence level. The confidence level is associated with a second order of the indicator and a first order of the indicator. The one or more instructions for determining whether the characteristic is stable includes one or more instructions for if the confidence level is equal to or higher than 95%, determining the characteristic to be stable, and one or more instructions for if the confidence level is lower than 95%, determining the characteristic to be unstable.

Many benefits are achieved by way of the present invention over conventional techniques. For example, the present technique provides an easy to use process that relies upon conventional technology. In some embodiments, the method provides reliable determination of product stability. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

Figure 2:
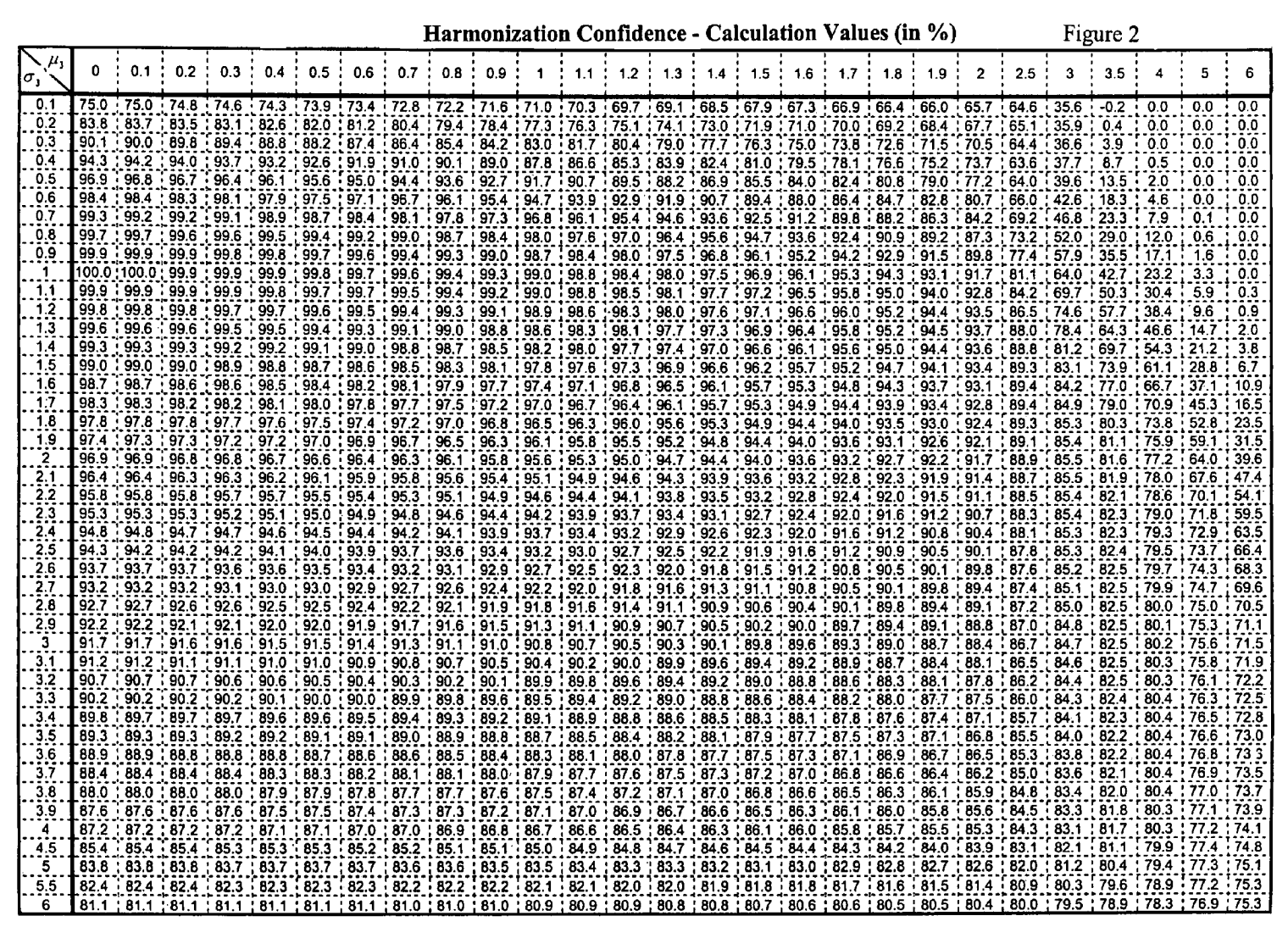

FIG. 2 is a simplified harmonization confidence as a function of two statistical parameters.

DETAILED DESCRIPTION OF THE INVENTION

Figure 1:
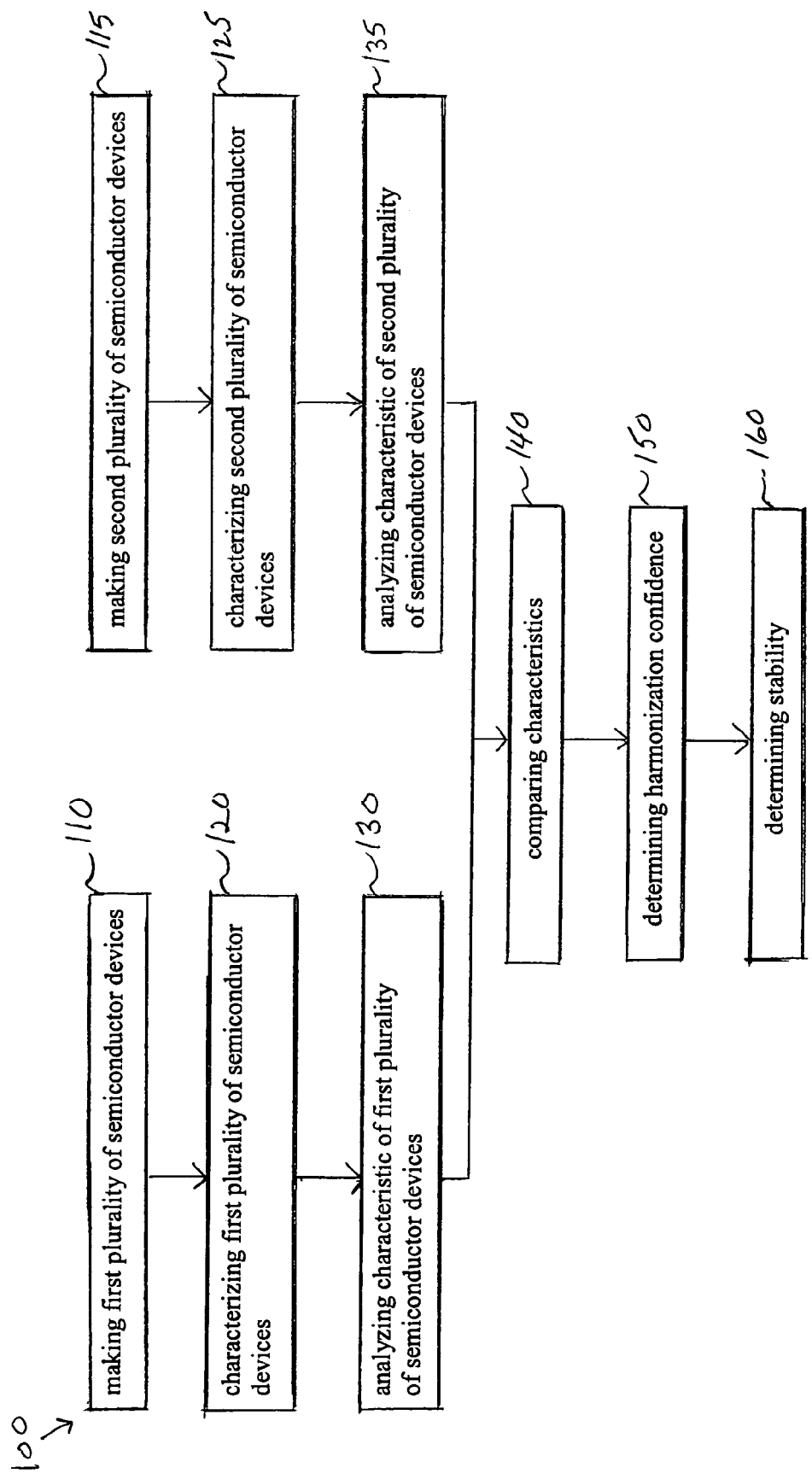
FIG. 1 is a simplified method for processing stability of semiconductor manufacture according to an embodiment of the present invention

The present invention is directed to integrated circuits and their processing for the manufacture of semiconductor devices. More particularly, the invention provides a method and system for processing stability of the manufacture of integrated circuits. Merely by way of example, the invention has been applied to certain quality characteristics for the manufacture of integrated circuits. But it would be recognized that the invention has a much broader range of applicability.

FIG. 1 is a simplified method for processing stability of semiconductor manufacture according to an embodiment of the present invention. This diagram is merely an example, which should not unduly limit the scope of the claims herein. The method 100 includes the following processes:
1. Process 110 for making first plurality of semiconductor devices;
2. Process 115 for making second plurality of semiconductor devices;
3. Process 120 for characterizing first plurality of semiconductor devices;
4. Process 125 for characterizing second plurality of semiconductor devices;
5. Process 130 for analyzing characteristic of first plurality of semiconductor devices;
6. Process 135 for analyzing characteristic of second plurality of semiconductor devices;
7. Process 140 for comparing characteristics
8. Process 150 for determining harmonization confidence;
9. Process 160 for determining stability.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

At the process 110, a first plurality of semiconductor devices is fabricated. The semiconductor devices may include various types of transistors, diodes, resistors, inductors, or others. Additionally, the semiconductor devices may include starting products or intermediate products of transistors, diodes, resistors, inductors, or others. In one embodiment, the fabrication of a transistor starts with a starting product and includes various processing steps. For example, the starting product includes a semiconductor substrate. The semiconductor may be silicon, germanium, gallium arsenide, or other material. The processing steps may include deposition, anneal, ion implantation, etching, or other. After each processing step, the resulting structure is an intermediate product.

At the process 115, a second plurality of semiconductor devices is fabricated. By design, the second plurality of semiconductor devices has at least one characteristic the same as the first plurality of semiconductor devices. In one embodiment, the characteristic is an in-line process parameter. For example, the characteristic is width of polysilicon layer, deposition thickness, or metal critical dimension. In another embodiment, the characteristic is a device or wafer acceptance parameter. For example, the characteristic is sheet resistance or breakdown voltage. In yet another embodiment, the second plurality of semiconductor devices has the same structural and functional specifications as the first plurality of semiconductor devices. For example, the second plurality of semiconductor devices by design are made with starting structures and fabrication processes the same as ones for the first plurality of semiconductor devices.

Additionally, the first plurality of semiconductor devices is made during a first period of time, and the second plurality of semiconductor devices is made during a second period of time. For example, the first period of time overlaps with the second period of time. In another example, the first period of time does not overlap with the second period of time.

Moreover, the first plurality of semiconductor devices and the second plurality of semiconductor devices are made in the same fabrication facility according to one embodiment of the present invention. For example, the first plurality of semiconductor devices and the second plurality of semiconductor devices are fabricated by the same set of manufacturing equipment. The set of manufacturing equipment may include, for example, a deposition chamber, an ion implanter, an anneal chamber, an etching chamber, or other.

At the process 120, the first plurality of semiconductor devices is characterized. In one embodiment, a certain structural and functional parameter is measured for some or all of the first plurality of semiconductor devices. For example, the structural parameter is a dimension of a deposited layer, such as width of polysilicon layer, deposition thickness, or metal critical dimension. In another example, the structural parameter is a doping profile, a mobility profile, a stress profile, or other. In yet another embodiment, the function parameter is sheet resistance, turn-on voltage, breakdown voltage, leakage current, or other. In another embodiment, more than one structural and functional parameter is measured for some or all of the first plurality of semiconductor devices. In yet another embodiment, one or more parameters associated with the first plurality of semiconductor devices including or other than one or more structural and function parameters are measured for some or all of the first plurality of semiconductor devices. Additionally, as discussed above, some or all of the first plurality of semiconductor devices are characterized. For example, the characterized semiconductor devices are selected from the first plurality of semiconductor devices randomly or based on a first predetermined condition.

At the process 125, the second plurality of semiconductor devices is characterized. One or more parameters determined for the first plurality of semiconductor devices are also measured for some or all of the first plurality of semiconductor devices. According to one embodiment, the characterized semiconductor devices are selected from the second plurality of semiconductors randomly or based on a second predetermined condition. For example, the second predetermined condition may be the same or different from the first predetermined condition.

At the process 130, the characteristic of the first plurality of semiconductor devices is analyzed. In one embodiment, the one or more parameters measured for some or all of the first plurality of semiconductor devices are processed statistically. For example, the measured values are modeled with a symmetric bell shaped normal distribution $N(\mu_1, \sigma_1^2)$. $\mu_1$ is a mean parameter and $\sigma_1$ is a standard deviation parameter for some or all of the first plurality of semiconductor devices. In another example, the measured values are analyzed with a statistical model other than the normal distribution.

At the process 135, the characteristic of the second plurality of semiconductor devices is analyzed. In one embodiment, the one or more parameters measured for some or all of the second plurality of semiconductor devices are processed statistically. For example, the measured values are modeled with a symmetric bell shaped normal distribution $N(\mu_2, \sigma_2^2)$. $\mu_2$ is a mean parameter and $\sigma_2$ is a standard deviation parameter for some or all of the second plurality of semiconductor devices. In another example, the measured values are analyzed with a statistical model other than the normal distribution. The statistical model is the same as one used of the first plurality of semiconductor devices with the same or different values for statistical parameters used.

At the process 140, the characteristics of the first plurality of semiconductor devices and the second plurality of semiconductor devices are compared. In one embodiment, the measured values for the first plurality of semiconductor devices are modeled with $N(\mu_1, \sigma_1^2)$, and the measured values for the second plurality of semiconductor devices are modeled with $N(\mu_2, \sigma_2^2)$. Through a mathematical transformation, the normal distribution for the first plurality of semiconductor devices is converted to a standard normal distribution $N(0, 1)$. The standard normal distribution has a mean value of zero and a standard deviation parameter of one. The same mathematical transformation converts the normal distribution of the second plurality of semiconductor devices to another normal distribution $N(\mu_3, \sigma_3^2)$, where $$\mu_3 = \frac{1}{\sigma_1}(\mu_2 - \mu_1) \quad \text{(Equation 1)}$$

$$\sigma_3 = \frac{\sigma_2}{\sigma_1} \quad \text{(Equation 2)}$$

According to one embodiment of the present invention, the comparison between the characteristics of the first plurality and the second plurality of semiconductor devices is measured by the overlapping area of the standard normal distribution $N(0, 1)$ and $N(\mu_3, \sigma_3^2)$ between the interested interval CD. Specifically, the overlapping area is determined as follows: is a binary function:

$$A(\mu_3, \sigma_3) = \left(\frac{1}{2}\int_C^D \left[e^{-\frac{y^2}{2}} + \frac{1}{\sigma_3}e^{-\frac{(y-\mu_3)^2}{2\sigma_3^2}}\right]dy\right) \bigg/ \int_{-3}^{3} e^{-\frac{y^2}{2}} dy \quad \text{(Eqaution 3)}$$

where $C=\max(-3, \mu_3-3\sigma_3)$ \quad (Equation 4)

and $D=\min(3, \mu_3+3\sigma_3)$ \quad (Equation 5)

At the process 150, harmonization confidence is determined. For example, the harmonization confidence is defined as follows.

$$HC1 = (-0.56A^2 + 1.56A) \times 100\% \quad \text{(Equation 6)}$$

where HC1 is the harmonization confidence which may range from 0% and 100%. The calculated HC1 from Equation 6 is in percentage. For example, if A is 0.8, HC1 would equal 88.96%. According to one embodiment of the present invention, HC1 is associated with the degree of stability of a product characteristic from the first period of time and the second period of time. As shown in Equation 6, the harmonization confidence is a binary function of $\mu_3$ and $\sigma_3$. FIG. 2 is a simplified harmonization confidence as a function of $\mu_3$ and $\sigma_3$. This diagram is merely an example, which should not unduly limit the scope of the claims. One of ordinary skill in the art would recognize many variations, alternatives, and modifications. As shown in FIG. 2, $\mu_3$ varies from 0 to 6 in the rows and $\sigma_3$ varies from 0.1 to 6 in the columns. The harmonization confidence is symmetric to 0 with respect to $\mu_3$, so the table also covers $\mu_3$ values ranging from 0 to −6. The process 150 may be performed by using the table in FIG. 2.

At the process 160, the stability of a product characteristic is determined based on the harmonization confidence. For example, if the harmonization confidence is higher than or equal to 95%, the product characteristic is considered stable. In another example, if the harmonization confidence is higher than or equal to 99%, the product characteristic is considered highly stable. In one embodiment, if a product characteristic is not considered to be stable, the product performance may vary significantly from time to time. Such variation may have an adverse impact on system integration and limit the use of such product in critical applications with a narrow tolerance. In another embodiment, if a product characteristic is considered to be highly stable, the product performance remains substantially the same from time to time. Such product may be preferred for critical applications.

As discussed above and further emphasized here, FIG. 1 is merely an example, which should not unduly limit the scope of the claims. One of ordinary skill in the art would recognize many variations, alternatives, and modifications. In one embodiment, the product parameter measured and analyzed by the method 100 is any quality characteristic. For example, the product parameter is a physical characteristic, such as length, weight, pressure, voltage, current, or viscosity. In another example, the product parameter is a sensory characteristic, such as taste, color, or easiness of use. In yet another example, the product parameter is a time-dependant characteristic, such as reliability or durability. In another embodiment, the method 100 is applied to any product, not limited to semiconductor device.

In one embodiment of the present invention, some or all processes of the method 100 can be performed by a computer system. For example, a computer program product includes a computer-readable medium including instructions for processing stability of semiconductor devices. The computer-readable medium includes one or more instructions for receiving a first plurality of measured values corresponding to a characteristic associated with a first plurality of semiconductor devices, and one or more instructions for receiving a second plurality of measured values corresponding to the characteristic associated with a second plurality of semiconductor devices. Additionally, the computer-readable medium includes one or more instructions for performing a first statistical analysis for the first plurality of measured values, one or more instructions for determining a first statistical distribution based on at least information associated with the first statistical analysis, one or more instructions for performing a second statistical analysis for the second plurality of measured values, one or more instructions for determining a second statistical distribution based on at least information associated with the second statistical analysis, and one or more instructions for processing information associated with the first statistical distribution and the second statistical distribution. Moreover, the computer-readable medium includes one or more instructions for determining an indicator based on at least information associated with the first statistical distribution and the second statistical distribution. The indicator is associated with an overlapping area between the first statistical distribution and the second statistical distribution. Also, the computer-readable medium includes one or more instructions for processing information associated with the indicator, one or more instructions for determining a confidence level based on at least information associated with the indicator, one or more instructions for processing information associated with the confidence level, and one or more instructions for determining whether the characteristic is stable based on at least information associated with the confidence level. The confidence level is associated with a second order of the indicator and a first order of the indicator. The one or more instructions for determining whether the characteristic is stable includes one or more instructions for if the confidence level is equal to or higher than 95%, determining the characteristic to be stable, and one or more instructions for if the confidence level is lower than 95%, determining the characteristic to be unstable.

For example, the confidence level is equal to a percentage number associated with a sum of the second order of the indicator multiplied by −0.56 and the first order of the indicator multiplied by 1.56. The one or more instructions for determining whether the characteristic is stable further comprises one or more instructions for if the confidence level is equal to or higher than 99%, determining the characteristic to be highly stable. In another example, the indicator is dependent upon only a first statistical parameter and a second statistical parameter. The one or more instructions for determining a confidence level includes one or more instructions for obtaining the confidence level from a table. The table provides the confidence level as a function of the first statistical parameter and the second statistical parameter. In yet another example, the first statistical distribution is a first normal distribution associated with a first mean and a first standard deviation, and a second statistical distribution is a second normal distribution associated with a second mean and a second standard deviation. The indicator is dependent upon only a first statistical parameter and a second statistical parameter. The first statistical parameter is proportional to a difference between the first mean and the second mean, and the second statistical parameter is associated with a ratio between the first standard deviation and the second standard deviation. In yet another example, the first plurality of semiconductor devices is associated with a first period of time, and the second plurality of semiconductor devices is associated with a second period of time. The first plurality of semiconductor devices and the second plurality of semiconductor devices are associated with a same fabrication facility.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing stability of semiconductor devices, the method comprising:
   providing a first plurality of semiconductor devices;
   providing a second plurality of semiconductor devices;
   obtaining a first plurality of measured values corresponding to a characteristic associated with the first plurality of semiconductor devices;
   obtaining a second plurality of measured values corresponding to the characteristic associated with the second plurality of semiconductor devices;
   performing a first statistical analysis for the first plurality of measured values;
   determining a first statistical distribution based on at least information associated with the first statistical analysis;
   performing a second statistical analysis for the second plurality of measured values;
   determining a second statistical distribution based on at least information associated with the second statistical analysis;
   processing information associated with the first statistical distribution and the second statistical distribution;
   determining an indicator based on at least information associated with the first statistical distribution and the second statistical distribution, the indicator being associated with an overlapping area between the first statistical distribution and the second statistical distribution;
   processing information associated with the indicator;
   determining a confidence level based on at least information associated with the indicator;
   processing information associated with the confidence level;
   determining whether the characteristic is stable based on at least information associated with the confidence level;
   wherein the confidence level is associated with a second order of the indicator and a first order of the indicator;
   wherein the determining whether the characteristic is stable includes:
      if the confidence level is equal to or higher than 95%, determining the characteristic to be stable;
      if the confidence level is lower than 95%, determining the characteristic to be unstable.

2. The method of claim 1 wherein the confidence level is equal to a percentage number associated with a sum of the second order of the indicator multiplied by −0.56 and the first order of the indicator multiplied by 1.56.

3. The method of claim 2 wherein the determining whether the characteristic is stable further comprises if the confidence level is equal to or higher than 99%, determining the characteristic to be highly stable.

4. The method of claim 1 wherein the indicator is dependent upon only a first statistical parameter and a second statistical parameter.

5. The method of claim 4 wherein the determining a confidence level comprises:
   obtaining the confidence level from a table;
   wherein the table provides the confidence level as a function of the first statistical parameter and the second statistical parameter.

6. The method of claim 1 wherein the first statistical distribution is a first normal distribution associated with a first mean and a first standard deviation, and a second statistical distribution is a second normal distribution associated with a second mean and a second standard deviation.

7. The method of claim 6 wherein the determining a first statistical distribution comprises determining the first mean and the first standard deviation based on at least information associated with the first statistical analysis, and the determining a second statistical distribution comprises determining the second mean and the second standard deviation based on at least information associated with the second statistical analysis.

8. The method of claim 7 wherein the indicator is dependent upon only a first statistical parameter and a second statistical parameter, the first statistical parameter being proportional to a difference between the first mean and the second mean, the second statistical parameter being associated with a ratio between the first standard deviation and the second standard deviation.

9. The method of claim 1 wherein the first plurality of semiconductor devices is associated with a first period of time, and the second plurality of semiconductor devices is associated with a second period of time.

10. The method of claim 9 wherein the first plurality of semiconductor devices and the second plurality of semiconductor devices are associated with a same fabrication facility.

11. The method of claim 1 wherein the characteristic is either a structural parameter or a functional parameter.

12. A computer-readable medium including instructions for processing stability of semiconductor devices, the computer-readable medium comprising:
   one or more instructions for receiving a first plurality of measured values corresponding to a characteristic associated with a first plurality of semiconductor devices;
   one or more instructions for receiving a second plurality of measured values corresponding to the characteristic associated with a second plurality of semiconductor devices;
   one or more instructions for performing a first statistical analysis for the first plurality of measured values;
   one or more instructions for determining a first statistical distribution based on at least information associated with the first statistical analysis;
   one or more instructions for performing a second statistical analysis for the second plurality of measured values;
   one or more instructions for determining a second statistical distribution based on at least information associated with the second statistical analysis;
   one or more instructions for processing information associated with the first statistical distribution and the second statistical distribution;
   one or more instructions for determining an indicator based on at least information associated with the first statistical distribution and the second statistical distribution, the indicator being associated with an overlapping area between the first statistical distribution and the second statistical distribution;
   one or more instructions for processing information associated with the indicator;
   one or more instructions for determining a confidence level based on at least information associated with the indicator;
   one or more instructions for processing information associated with the confidence level;
   one or more instructions for determining whether the characteristic is stable based on at least information associated with the confidence level;

wherein the confidence level is associated with a second order of the indicator and a first order of the indicator;
wherein the one or more instructions for determining whether the characteristic is stable includes:
one or more instructions for if the confidence level is equal to or higher than 95%, determining the characteristic to be stable;
one or more instructions for if the confidence level is lower than 95%, determining the characteristic to be unstable.

13. The computer-readable medium of claim 12 wherein the confidence level is equal to a percentage number associated with a sum of the second order of the indicator multiplied by −0.56 and the first order of the indicator multiplied by 1.56.

14. The computer-readable medium of claim 13 wherein the one or more instructions for determining whether the characteristic is stable further comprises one or more instructions for if the confidence level is equal to or higher than 99%, determining the characteristic to be highly stable.

15. The computer-readable medium of claim 12 wherein the indicator is dependent upon only a first statistical parameter and a second statistical parameter.

16. The computer-readable medium of claim 15 wherein the one or more instructions for determining a confidence level comprises:
one or more instructions for obtaining the confidence level from a table;
wherein the table provides the confidence level as a function of the first statistical parameter and the second statistical parameter.

17. The computer-readable medium of claim 12 wherein the first statistical distribution is a first normal distribution associated with a first mean and a first standard deviation, and a second statistical distribution is a second normal distribution associated with a second mean and a second standard deviation.

18. The computer-readable medium of claim 17 wherein the indicator is dependent upon only a first statistical parameter and a second statistical parameter, the first statistical parameter being proportional to a difference between the first mean and the second mean, the second statistical parameter being associated with a ratio between the first standard deviation and the second standard deviation.

19. The computer-readable medium of claim 12 wherein the first plurality of semiconductor devices is associated with a first period of time, and the second plurality of semiconductor devices is associated with a second period of time.

20. The computer-readable medium of claim 19 wherein the first plurality of semiconductor devices and the second plurality of semiconductor devices are associated with a same fabrication facility.

* * * * *